(12) United States Patent
Lin

(10) Patent No.: US 12,191,277 B2
(45) Date of Patent: Jan. 7, 2025

(54) MANUFACTURING METHOD OF AN ELECTRONIC APPARATUS

(71) Applicant: Innolux Corporation, Miao-Li County (TW)

(72) Inventor: Ming-Chang Lin, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 265 days.

(21) Appl. No.: 17/692,047

(22) Filed: Mar. 10, 2022

(65) Prior Publication Data

US 2022/0328448 A1 Oct. 13, 2022

(30) Foreign Application Priority Data

Apr. 9, 2021 (CN) .......................... 202110387357.X
Sep. 30, 2021 (CN) .......................... 202111161730.6

(51) Int. Cl.
*H01L 23/00* (2006.01)
*H01L 25/075* (2006.01)
*H01L 25/16* (2023.01)

(52) U.S. Cl.
CPC .............. *H01L 24/81* (2013.01); *H01L 24/05* (2013.01); *H01L 24/13* (2013.01); *H01L 24/16* (2013.01);
(Continued)

(58) Field of Classification Search
CPC ......... H01L 24/81; H01L 24/05; H01L 24/13; H01L 24/16; H01L 25/0753;
(Continued)

(56) References Cited

U.S. PATENT DOCUMENTS 10,214,415 B1 * 2/2019 Griffin .................. B81B 7/0019
2004/0207059 A1 * 10/2004 Hong .................. H01L 23/3135
257/E23.126
(Continued)

FOREIGN PATENT DOCUMENTS

CN 101287332 10/2008
TW 520816 2/2003
(Continued)

OTHER PUBLICATIONS

"Office Action of Taiwan Counterpart Application", issued on Mar. 20, 2023, p. 1-p. 10.

*Primary Examiner* — Karen Kusumakar
*Assistant Examiner* — Shawn Shaw Muslim
(74) *Attorney, Agent, or Firm* — JCIPRNET

(57) ABSTRACT

A manufacturing method of an electronic apparatus is provided, and the manufacturing method includes following steps. A substrate is provided. A plurality of first bonding pads are formed on the substrate. A plurality of electronic devices are provided, and each of the electronic devices includes at least one second bonding pad. The second bonding pads of the electronic devices corresponding to the first bonding pads are laminated onto the corresponding first bonding pads on the substrate, so as to bond the electronic devices to the substrate. The corresponding first and second bonding pads respectively have bonding surfaces with different surface topographies. The manufacturing method of the electronic apparatus is capable of reducing short circuit during a bonding process or improving a bonding yield.

18 Claims, 6 Drawing Sheets

(52) U.S. Cl.
CPC ........ *H01L 25/0753* (2013.01); *H01L 25/167* (2013.01); *H01L 24/95* (2013.01); *H01L 2224/05017* (2013.01); *H01L 2224/05144* (2013.01); *H01L 2224/05147* (2013.01); *H01L 2224/05558* (2013.01); *H01L 2224/05573* (2013.01); *H01L 2224/05686* (2013.01); *H01L 2224/13016* (2013.01); *H01L 2224/13019* (2013.01); *H01L 2224/13144* (2013.01); *H01L 2224/13147* (2013.01); *H01L 2224/1357* (2013.01); *H01L 2224/13686* (2013.01); *H01L 2224/16014* (2013.01); *H01L 2224/16057* (2013.01); *H01L 2224/1607* (2013.01); *H01L 2224/16145* (2013.01); *H01L 2224/16227* (2013.01); *H01L 2224/8102* (2013.01); *H01L 2224/81385* (2013.01); *H01L 2224/81395* (2013.01); *H01L 2224/81444* (2013.01); *H01L 2224/81447* (2013.01); *H01L 2224/81486* (2013.01); *H01L 2224/8183* (2013.01); *H01L 2924/0541* (2013.01)

(58) Field of Classification Search
CPC ................... H01L 25/167; H01L 24/95; H01L 2224/05017; H01L 2224/05144; H01L 2224/05147; H01L 2224/05558; H01L 2224/05573; H01L 2224/05686; H01L 2224/13016; H01L 2224/13019; H01L 2224/13144; H01L 2224/13147; H01L 2224/1357; H01L 2224/13686; H01L 2224/16014; H01L 2224/16057; H01L 2224/1607; H01L 2224/16145; H01L 2224/16227; H01L 2224/8102; H01L 2224/81385; H01L 2224/81395; H01L 2224/81444; H01L 2224/81447; H01L 2224/81486; H01L 2224/8183; H01L 2924/0541; H01L 2221/68354; H01L 21/6835; H01L 2221/68368; H01L 2224/136; H01L 2224/13639; H01L 2224/13644; H01L 2224/13663; H01L 2224/13664; H01L 2224/13666; H01L 2224/13669; H01L 2224/1367; H01L 2224/13671; H01L 2224/13672; H01L 2224/13673; H01L 2224/13676; H01L 2224/13678; H01L 2224/13679; H01L 2224/1368; H01L 2224/13681; H01L 2224/13683; H01L 2224/13684; H01L 2224/16237; H01L 2224/814; H01L 2224/81439; H01L 2224/81463; H01L 2224/81464; H01L 2224/81466; H01L 2224/81469; H01L 2224/8147; H01L 2224/81471; H01L 2224/81472; H01L 2224/81473; H01L 2224/81476; H01L 2224/81478; H01L 2224/81479; H01L 2224/8148; H01L 2224/81481; H01L 2224/81483; H01L 2224/81484; H01L 2224/8182; H01L 2224/16225; H01L 2224/81001; H01L 2224/81191; H01L 2224/95001; H01L 2924/12041; H01L 33/62

See application file for complete search history.

(56) References Cited

U.S. PATENT DOCUMENTS

| | | | |
|---|---|---|---|
| 2007/0205520 A1* | 9/2007 | Chou | H01L 24/12 257/E23.129 |
| 2017/0346011 A1* | 11/2017 | Danesh | H10K 71/00 |
| 2019/0115274 A1* | 4/2019 | Hu | H01L 25/167 |
| 2019/0157532 A1* | 5/2019 | Meitl | H01L 33/0095 |
| 2020/0006284 A1* | 1/2020 | Chen | H01L 21/76251 |
| 2020/0335279 A1* | 10/2020 | Jiayin | B22F 1/065 |

FOREIGN PATENT DOCUMENTS

| | | |
|---|---|---|
| TW | 201814862 | 4/2018 |
| TW | 202023047 | 6/2020 |

* cited by examiner

MANUFACTURING METHOD OF AN ELECTRONIC APPARATUS

CROSS-REFERENCE TO RELATED APPLICATION

This application claims the priority benefit of China patent application serial no. 202110387357.X, filed on Apr. 9, 2021, and China patent application serial no. 202111161730.6, filed on Sep. 30, 2021. The entirety of each of the above-mentioned patent applications is hereby incorporated by reference herein and made a part of this specification.

BACKGROUND

Technical Field

The disclosure relates to a manufacturing method of an electronic apparatus; more particularly, the disclosure relates to a manufacturing method of an electronic apparatus capable of better preventing short circuit during a bonding process or improving a bonding yield.

Description of Related Art

With the miniaturization of electronic apparatuses, contact pitches of electronic devices are correspondingly shortened, thus increasing difficulties of bonding the electronic devices and a carrier board. In view of the above, manufacturers are endeavored to improve the bonding yield.

SUMMARY

The disclosure provides a manufacturing method of an electronic apparatus capable of better preventing short circuit during a bonding process or improving a bonding yield.

In an embodiment of the disclosure, a manufacturing method of an electronic apparatus includes following steps. A substrate is provided. A plurality of first bonding pads are formed on the substrate. A plurality of electronic devices are provided, and each of the electronic devices includes at least one second bonding pad. The second bonding pads of the electronic devices corresponding to the first bonding pads are laminated onto the corresponding first bonding pads on the substrate, so as to bond the electronic devices to the substrate. The corresponding first and second bonding pads respectively have bonding surfaces with different surface topographies.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
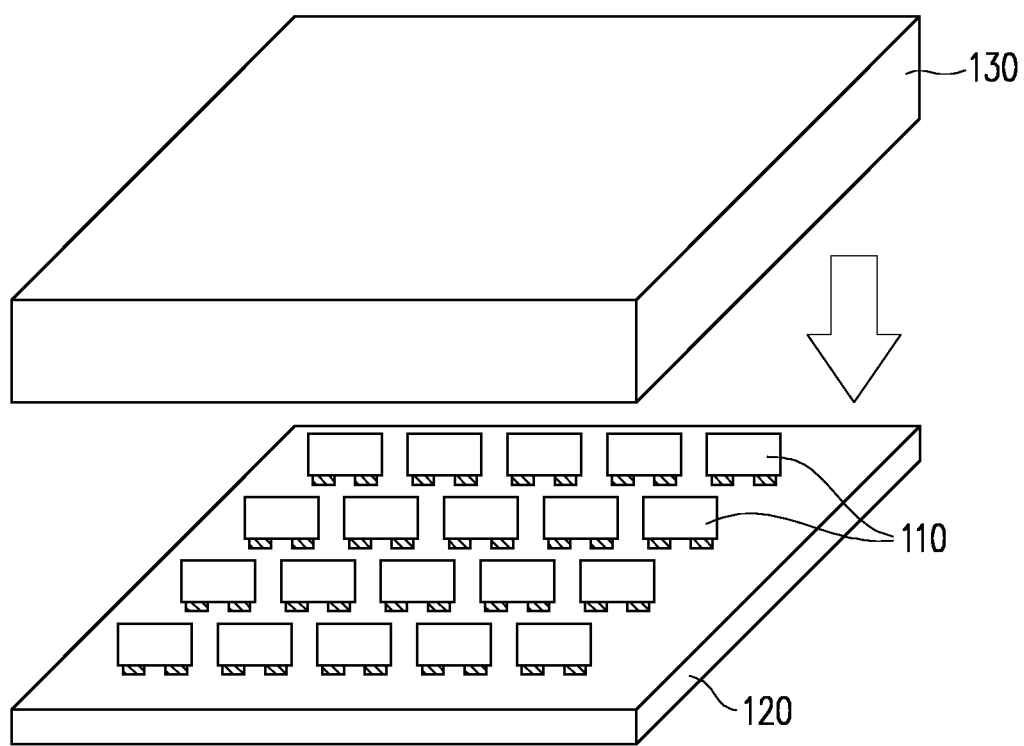
FIG. 1A to FIG. 1C are schematic three-dimensional diagrams illustrating a manufacturing method of an electronic apparatus according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

In the following specification and claims, the terms "having", "including", etc. are open-ended terms, so they should be interpreted to mean "including but not limited to . . . ".

It should be understood that when a component or a film layer is described as being "on" or "connected to" another component or film layer, it may be directly on or connected to the another component or film layer, or there is an intervening component or film layer therebetween (i.e., indirect connection). Conversely, when a component or film layer is described as being "directly on" or "directly connected to" another component or film layer, there is no intervening component or film layer therebetween.

The terms such as "first", "second", "third", etc. may be used to describe components, but the components should not be limited by these terms. The terms are only intended to distinguish a component from another component in the specification. It is possible that the claims do not use the same terms and replace the terms with "first", "second", "third" etc. according to the sequence declared in the claims. Accordingly, in the specification, a first component may be a second component in the claims.

In some embodiments of the disclosure, unless specifically defined, terms related to bonding and connection such as "connect", "interconnect", etc. may mean that two structures are in direct contact, or that two structures are not in direct contact with other structures provided therebetween. The terms related to bonding and connection may also cover cases where two structures are both movable or two structures are both fixed. In addition, the term "couple" includes any direct and indirect electrical connection means.

In the disclosure, the length and width may be measured by an optical microscope, and the thickness may be measured based on a cross-sectional image in an electron microscope, but the disclosure is not limited thereto. In addition, there may be a certain error between any two values or directions used for comparison.

In the disclosure, the electronic apparatus may include a display apparatus, a backlight apparatus, an antenna apparatus, a sensing apparatus, or a splicing apparatus, which should however not be construed as limitations in the disclosure. The electronic apparatus may be a bendable or flexible electronic apparatus. The display apparatus may be a non-self-luminous display apparatus or a self-luminous display apparatus. The antenna apparatus may be a liquid-crystal antenna or a non-liquid-crystal antenna apparatus. The sensing apparatus may sense capacitance, light, heat, or ultrasound, which should however not be construed as limitations in the disclosure. The electronic devices may include passive devices and active devices, such as capacitors, resistors, inductors, diodes, transistors, and so on. The diodes may include, for instance, an organic light emitting diode (OLED), a mini LED, a micro LED, or a quantum dot LED (e.g., QLED or QDLED), which should however not be construed as limitations in the disclosure. The splicing apparatus may be, for instance, a display splicing apparatus or an antenna splicing apparatus, which should however not be construed as limitations in the disclosure. It is noted that the electronic device may be but is not limited to any combination of the above. Hereinafter, a display apparatus will act as the electronic apparatus or the splicing apparatus to illustrate the content of the disclosure, which should however not be construed as limitations in the disclosure.

It should be noted that in the following embodiments, features in a plurality of embodiments may be replaced, recombined, or mixed to complete other embodiments without departing from the spirit of the disclosure. The features of the embodiments may be used in any combination without departing from the spirit of the disclosure or conflicting with each other.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 1B:
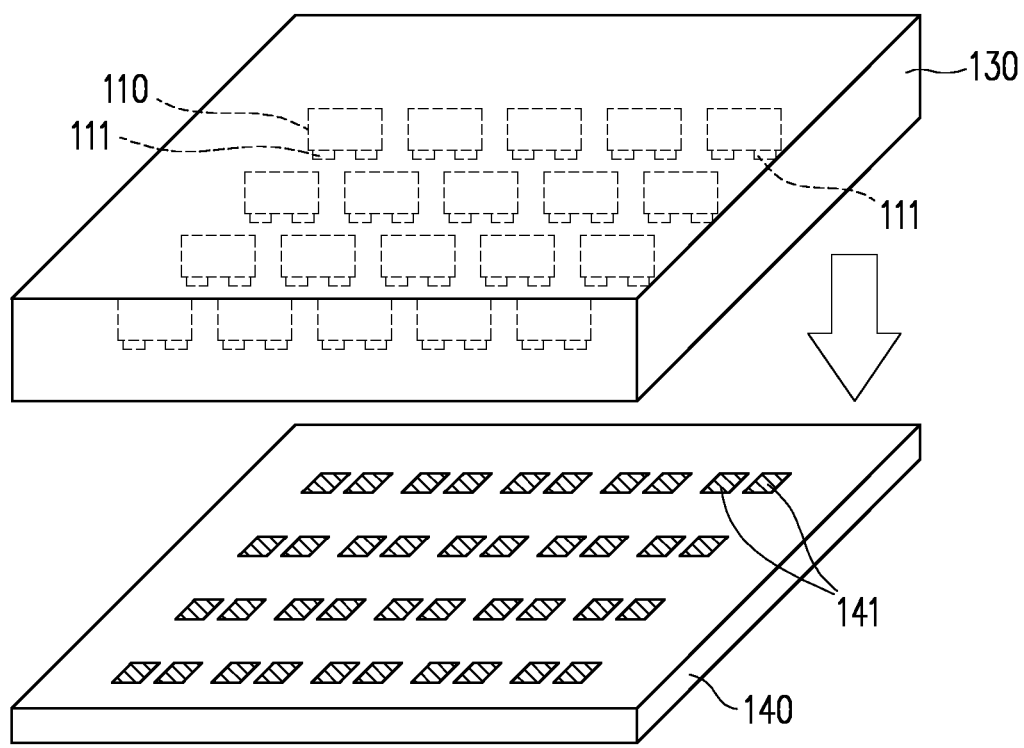
Figure 1C:
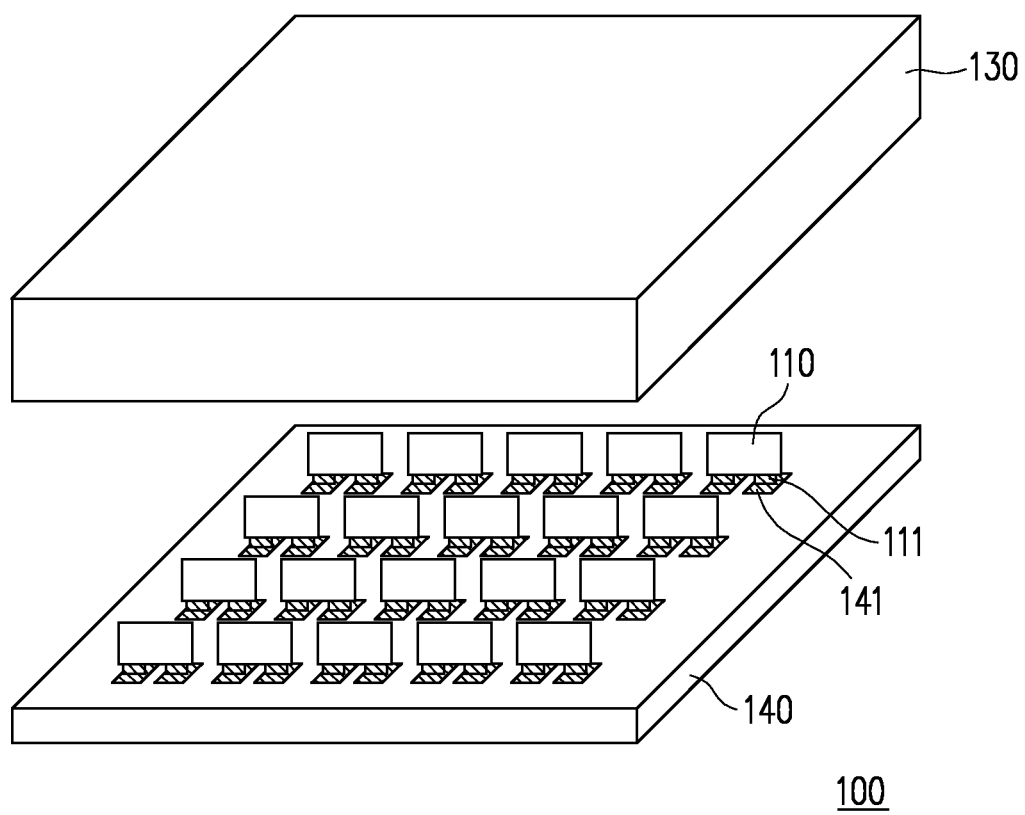
Figure 2A:
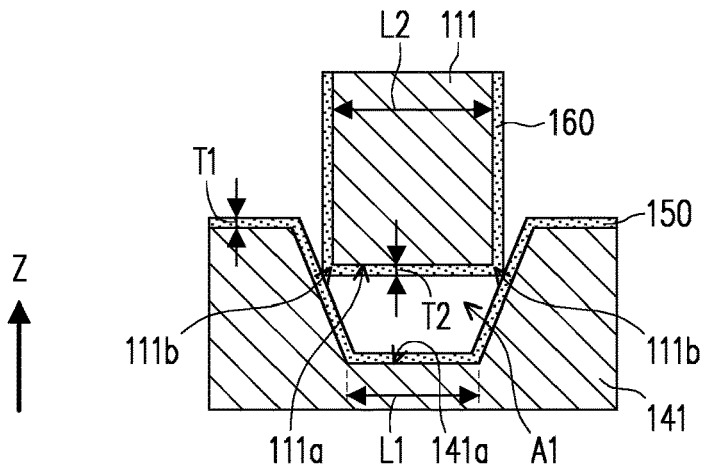
FIG. 2A to FIG. 2C are schematic cross-sectional diagrams of laminating the second bonding pads depicted in FIG. 1B to FIG. 1C to the first bonding pads.
Figure 2B:
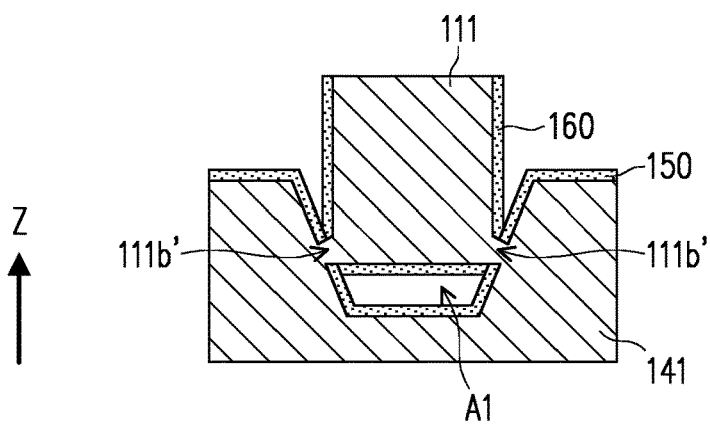
Figure 2C:
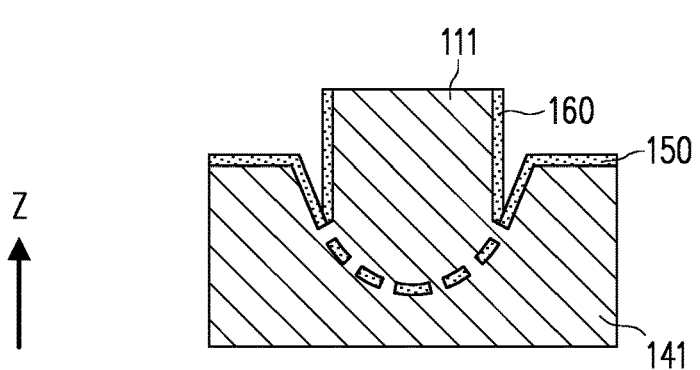

FIG. 1A to FIG. 1C are schematic three-dimensional diagrams illustrating a manufacturing method of an electronic apparatus according to an embodiment of the disclosure. FIG. 2A to FIG. 2C are schematic cross-sectional diagrams of laminating the second bonding pads depicted in FIG. 1B to FIG. 1C to the first bonding pads. Steps of the manufacturing method of the electronic apparatus 100 provided in this embodiment are described hereinafter.

With reference to FIG. 1A, a plurality of electronic devices 110 are formed on a growth substrate 120. Here, a dimension of the electronic devices 110 is less than 100 μm, for instance, which should however not be construed as a limitation in the disclosure. In some embodiments, the dimension may refer to a length or a width, which should however not be construed as a limitation in the disclosure. Besides, in some embodiments, at least one of the electronic devices 110 is a light emitting diode (LED), which should however not be construed as a limitation in the disclosure. Moreover, in this embodiment, the growth substrate may include a rigid substrate, a flexible substrate, or a combination thereof. For instance, a material of the growth substrate 120 may include glass, quartz, sapphire, ceramics, polycarbonate (PC), polyimide (PI), polyethylene terephthalate (PET), other appropriate substrate materials, or a combination thereof, which should however not be construed as a limitation in the disclosure.

With reference to FIG. 1A and FIG. 1B, a transfer substrate 130 is applied to pick up a plurality of electronic devices 110 on the growth substrate 120. In this embodiment, the pick-up method may be performed by, for instance, vacuum adsorption, adhesion with use of adhesive materials, electrostatic absorption positioning, magnetic adsorption positioning, or embedding the electronic devices by means of a matched structure formed in advance, which should however not be construed as a limitation in the disclosure. As shown in FIG. 1B, the transfer substrate 130 already picks up the electronic devices 110 on the growth substrate 120 to the transfer substrate 130. Here, the transfer substrate 130 may pick up a plurality of electronic devices 110 at one time.

With reference to FIG. 1B, a substrate 140 is provided, and a plurality of first bonding pads 141 are formed on the substrate 140. A driver circuit (not shown) may be disposed on the substrate 140 and may be an active driver circuit or a passive driver circuit. In some embodiments, the active driver circuit may include a transistor. The first bonding pads 141 are disposed on the substrate 140 and electrically connected to a driver circuit (not shown) on the substrate 140. In this embodiment, the substrate 140 may include a rigid substrate, a flexible substrate, or a combination thereof. For instance, a material of the substrate 140 may include glass, quartz, silicon wafer, silicon carbide wafer, sapphire, ceramics, PC, polymethylmethacrylate, siloxane, PI, PET, other appropriate substrate materials, or a combination thereof, which should however not be construed as a limitation in the disclosure.

As shown in FIG. 1B, the electronic devices 110 are provided, and each of the electronic devices 110 includes at least one second bonding pad 111. Specifically, after the transfer substrate 130 picks up the electronic devices 110 from the growth substrate 120, the transfer substrate 130 is moved to the substrate 140, so that the second bonding pads 111 of the electronic device 110 on the transfer substrate 130 may correspond to the first bonding pads 141 on the substrate 140. Here, materials of the corresponding first bonding pad 141 and second bonding pad 111 may both be copper or both be gold. The "corresponding relationship" mentioned herein may, for instance, indicate that the first bonding pads 141 and the second bonding pads 111 are partially overlapped in a normal direction of the substrate 140, or the first bonding pads 141 and the second bonding pads 111 are completely overlapped in the normal direction of the substrate 140.

With reference to FIG. 1C, the second bonding pads 111 of the electronic devices 110 are laminated onto the corresponding first bonding pads 141 on the substrate 140, so that the electronic devices 110 may be bonded to the substrate 140. Here, the corresponding first bonding pads 141 and second bonding pads 111 have bonding surfaces 141a and 111a with different surface topographies, respectively. Specifically, with reference to FIG. 2A to FIG. 2C, steps of laminating the second bonding pads 111 of the electronic devices 110 onto the corresponding first bonding pads 141 on the substrate 140 are described hereinafter.

Figure 3A:
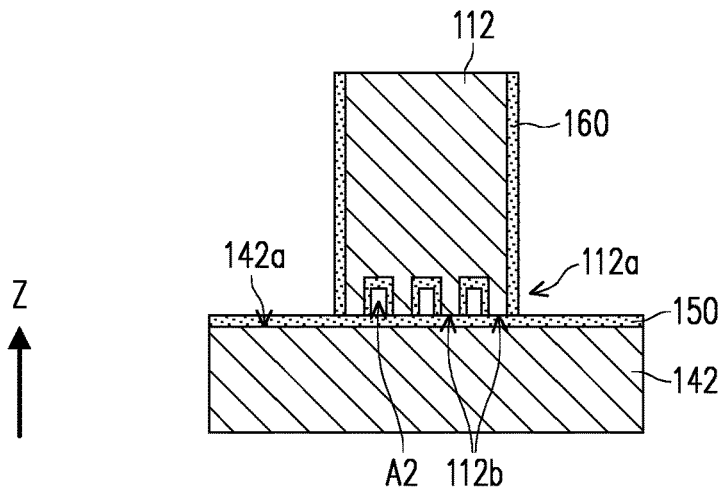
FIG. 3A to FIG. 3C are schematic partial cross-sectional diagrams illustrating a manufacturing method of an electronic apparatus according to another embodiment of the disclosure.
Figure 4A:
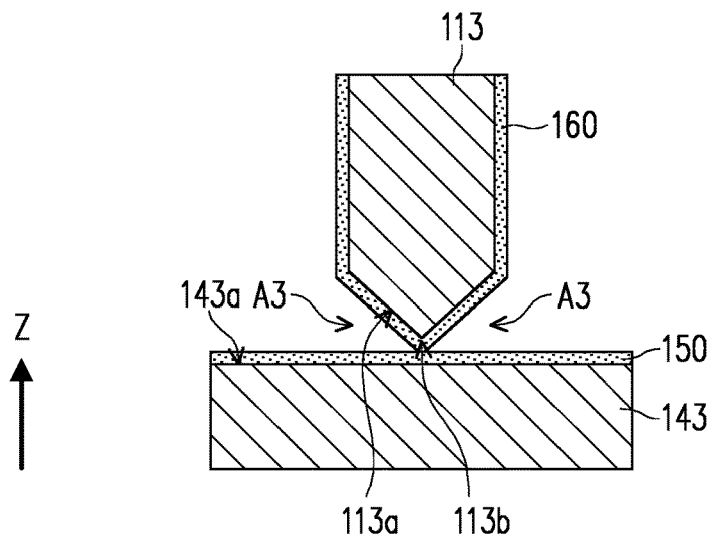
FIG. 4A to FIG. 4C are schematic partial cross-sectional diagrams illustrating a manufacturing method of an electronic apparatus according to another embodiment of the disclosure.

With reference to FIG. 2A, the second bonding pads 111 are allowed to contact the corresponding first bonding pads 141. In this embodiment, the topography or the profile of the bonding surface 141a of the first bonding pad 141 (i.e., the surface of the first bonding pad 141 where the second bonding pad 111 is bonded) may, for instance, have a concave shape, and the topography or the profile of the bonding surface 111a of the second bonding pad 111 (i.e., the surface of the second bonding pad 111 where the first bonding pad 141 is bonded) may, for instance, have a rectangular shape, which should however not be construed as limitations in the disclosure. Here, the concave shape and the rectangular shape do not match each other. For instance, the topography of the bonding surface 141a of the first bonding pad 141 is shaped as a recessed inverted trapezoid, and the topography of the bonding surface 111a of the second bonding pad 111 is shaped as a protruding rectangle. Here, the shape of the recessed inverted trapezoid and the shape of the protruding rectangle do not match each other, and a width L1 of a base of the inverted trapezoid is less than a width L2 of the rectangle. In some embodiments, "width" may be obtained by performing a cross-sectional measurement on the first bonding pads 141 and the second bonding pads 111 in the same direction. In some embodiments, on a cross-section in a direction, the width L2 of the rectangle may be defined as a width of two portions 111b of the second bonding pad 111 contacting the first bonding pad 141; in other words, the width L2 of the rectangle is a distance between the two portions 111b when the two portions 111b contact the first bonding pad 141. In some embodiments, the surface topographies of the bonding surfaces 141a of the first bonding pads 141 may also have a convex shape, for instance, and the surface topographies of the bonding surface 111a of the second bonding pads 111 may have a concave shape, for instance. Namely, the bonding surface of one of the first and second bonding pads 141 and 111 corresponding to each other may have a convex shape, and the bonding surface of the other may have a concave shape, for instance. In some embodiments, as shown in FIG. 3A and FIG. 4A, the surface topography of the bonding surface 141a of the first bonding pad 141 may be in other shapes, and the surface topography of the bonding surface 111a of the second bonding pad 111 may also be in other shapes, as long as the surface topographies of the bonding surfaces 141a of the first bonding pads 141 and the surface topographies of the bonding surfaces 111a of the second bonding pads 111a are different or do not match. In some embodiments, the bonding surface required for different designs (e.g., the bonding surface 141a of the first bonding pad 141 and the bonding surface 111a of the second bonding pad 111) may be formed by performing a lithography process, an etching process, a lift-off process, a printing process, a transfer printing process, a laser engraving process, or a micro-electromechanical process.

In this embodiment, a dimension of the concave bonding surface may be, for instance, greater than a dimension of the rectangular bonding surface. Thereby, during an initial stage of a bonding process (as shown in FIG. 2A), the bonding surface 111a of the rectangular second bonding pad 111 may be aligned and latched to a side wall of the concave bonding surface 141a of the first bonding pad 141, and only the portion 111b of the second bonding pad 111 is allowed to contact the first bonding pad 141. At this time, a gap A1 may be defined between the second bonding pad 111 and the first bonding pad 141 after the contact. In some embodiments, the dimension of the concave bonding surface may be, for instance, greater than the dimension of the convex bonding surface, which should however not be construed as a limitation in the disclosure.

In addition, the manufacturing method of the electronic apparatus provided in this embodiment further includes the following step: before the second bonding pads 111 of the electronic devices 110 are laminated onto the corresponding first bonding pads 141 on the substrate 140, an oxidation layer 150 is formed on the first bonding pads 141, and an oxidation layer 160 is formed on the second bonding pads 111. Here, the oxidation layer 150 may contact the first bonding pads 141, and the oxidation layer 160 may contact the second bonding pads 111. A thickness T1 of the oxidation layer 150 and a thickness T2 of the oxidation layer 160 may be, for instance, less than 10 nanometers (nm), which should however not be construed as a limitation in the disclosure. Here, the thickness T1 may be, for instance, the maximum thickness of the oxidation layer 150 measured along the normal direction of the substrate 140, and the thickness T2 may be, for instance, the maximum thickness of the oxidation layer 160 measured along the normal direction (a direction Z) of the substrate 140 corresponding to the second bonding surfaces 111a. In some embodiments, "thickness" may be obtained by performing a cross-sectional measurement on the oxidation layer 150 (or the oxidation layer 160) in the same direction.

With reference to FIG. 2B, a diffusion reaction is initiated, so that metal atoms of the second bonding pad 111 may diffuse at a portion 111b' of the second bonding pad 111 in a direction toward the first bonding pad 141 and pass through the oxidation layer 150, and metal atoms of the first bonding pad 141 may diffuse at the portion 111b' in a direction toward the second bonding pad 111 and pass through the oxidation layer 160. Specifically, since the thickness T1 of the oxidation layer 150 and the thickness T2 of the oxidation layer 160 are less than 10 nm, and the oxidation layer 150 may contact the oxidation layer 160 at the portion 111b', the metal atoms of the first bonding pad 141 and the metal atoms of the second bonding pad 111 may pass through the oxidation layer 150 and the oxidation layer 160 during the diffusion reaction.

With reference to FIG. 2B and FIG. 2C, the diffusion reaction continues to allow the diffused metal atoms of the second bonding pad 111 and the diffused metal atoms of the first bonding pad 141 to fill the gap A1 between the second bonding pad 111 and the first bonding pad 141 and allow the second bonding pad 111 of the electronic device 110 to be bonded to the first bonding pad 141 of the substrate 140. In this embodiment, the diffused metal atoms of the second bonding pads 111 and the diffused metal atoms of the first bonding pads 141 may fill the gaps A1 between the second bonding pads 111 and the first bonding pads 141. In some embodiments, the diffused metal atoms of the second bonding pads 111 and the diffused metal atoms of the first bonding pads 141 need not fill the gaps A1 between the second bonding pads 111 and the first bonding pads 141, given that a bonding strength of the second bonding pads 111 bonded to the first bonding pads 141 may withstand the subsequent manufacturing process, and that the second bonding pads 111 are not removed from the first bonding pads 141. In addition, after the second bonding pads 111 are bonded to the first bonding pads 141, a light-on test or the like may be performed to learn whether the bonding process is completed, for instance.

In this embodiment, only the portions 111b of the second bonding pads 111 may contact the first bonding pads 141 at the initial stage of the bonding process; hence, in a subsequent pressurization step during the diffusion reaction, the first bonding pads 141 may generate a relatively high stress on the portions 111b, so that the portions 111b may serve as the starting point of the diffusion reaction between the first bonding pads 141 and the second bonding pads 111. In this embodiment, the portions 111b are, for instance, portions of the second bonding pads 111 contacting the first bonding pads 141, which should however not be construed as a limitation in the disclosure.

In this embodiment, conditions on which the diffusion reaction is initiated may include at least a reaction time, a reaction temperature, and a reaction stress. Although the numeric values of the reaction time, the reaction temperature, and the reaction stress may be adjusted according to actual requirements, when the diffusion reaction is initiated to bond metal in a solid form, the reaction stress, the reaction temperature, and the reaction time may lead to damages to the structure or the material of the electronic devices or impair production speed. In the manufacturing method of the electronic apparatus according to this embodiment, the corresponding first and second bonding pads 141 and 111 may be designed to have bonding surfaces with different surface topographies, so that only the portion 111*b* of the second bonding pad 111 is allowed to contact the first bonding pad 141; as such, compared to the diffusion reaction initiated when the two matched bonding surfaces are completely in contact with each other, the diffusion reaction may be initiated at a relatively low reaction stress when only the portion 111*b* is allowed to contact the first bonding pad 141. Thereby, the manufacturing method of the electronic apparatus provided in this embodiment may, with a relatively low reaction stress, bond the metal (i.e., the second bonding pads 111 and the first bonding pads 141) in a solid form.

In this embodiment, during the diffusion reaction, the first bonding pads 141, the oxidation layer 150, the second bonding pads 111, and the oxidation layer 160 are not melted, and the first bonding pads 141 and the second bonding pads 111 may be bonded in a solid state through diffusion, so that the second bonding pads 111 of the electronic devices 110 may be bonded to the first bonding pads 141 on the substrate 140.

In addition, in this embodiment, during the diffusion reaction, when the heights of the second bonding pads 111 of different electronic devices 110 are different (e.g., with a height difference from 1 μm to 2 μm), the higher second bonding pads 111 may first contact the corresponding first bonding pads 141 and may be deformed to fill the gaps A1, and the lower second bonding pads 111 may then contact the corresponding first bonding pads 141 and may be bonded. Therefore, the manufacturing method of the electronic apparatus provided in this embodiment may also be applied to resolve the bonding yield issue resulting from the difference in the heights of the second bonding pads 111.

In the manufacturing method of the electronic apparatus according to some embodiments, before the second bonding pads 111 of the electronic devices 110 are laminated onto the corresponding first bonding pads 141 of the substrate 140, the manufacturing method may further include a step of forming a passivation layer on the bonding surfaces 141*a* of the first bonding pads 141 and forming a passivation layer on the bonding surfaces 111*a* of the second bonding pads 111. Thereby, the second bonding pads 111 and the first bonding pads 141 may easily pass through the passivation layers for diffusion in the subsequent diffusion reaction. Here, a material of the passivation layer may include silver (Ag), gold (Au), chromium (Cr), hafnium (Hf), iridium (Ir), molybdenum (Mo), niobium (Nb), osmium (Os), palladium (Pd), platinum (Pt), rhenium (Re), rhodium (Rh), ruthenium (Ru), tantalum (Ta), titanium (Ti), vanadium (V), tungsten (W), zirconium (Zr), or other metals or alloy which may not be easily oxidized and may have low activity, which should however not be construed as a limitation in the disclosure.

In short, in the manufacturing method of the electronic apparatus 100 provided in one or more embodiments of the disclosure, the first bonding pads 141 and the second bonding pads 111 respectively have the bonding surfaces with different surface topographies, so that only the portions 111*b* of the second bonding pads 111 are allowed to contact the first bonding pads 141. Compared to the diffusion reaction initiated when the two matched bonding surfaces are completely in contact with each other, the diffusion reaction may be initiated at a relatively low reaction stress when only the portion 111*b* is allowed to contact the first bonding pad 141. Thereby, the problem of damaging the structure of the electronic devices due to the excessive reaction stress may be mitigated; further, the issue of short circuit may be alleviated, or the bonding yield may be increased.

Other embodiments will be provided below for explanation. Note that the following embodiments apply the reference numbers and part of the content provided in the previous embodiment, the same reference numbers serve to denote the same or similar devices, and the description of the same technical content is omitted. The description of the omitted part may be derived from the previous embodiment and will not be repeated in the following embodiments.

Figure 3B:
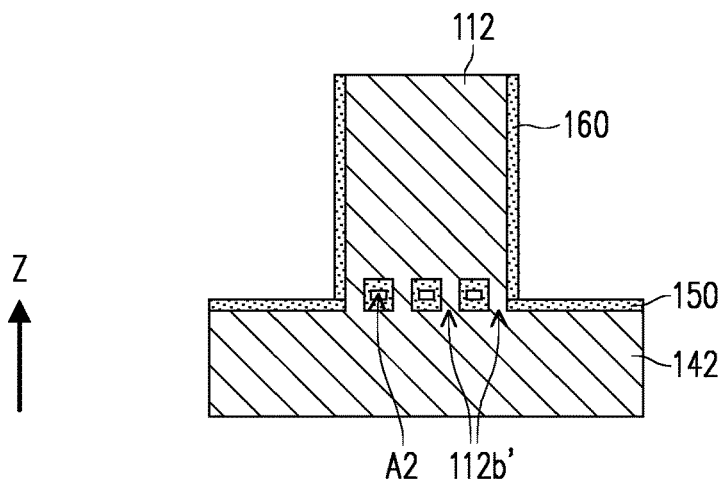
Figure 3C:
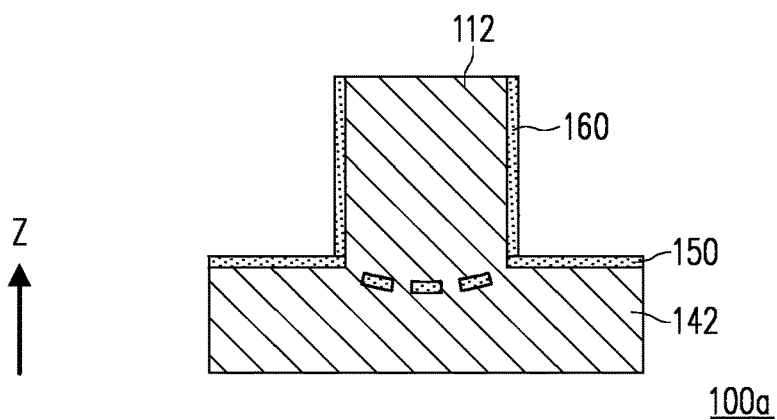

FIG. 3A to FIG. 3C are schematic partial cross-sectional diagrams illustrating a manufacturing method of an electronic apparatus according to another embodiment of the disclosure. With reference to FIG. 3A-FIG. 3C and FIG. 2A-FIG. 2C at the same time, an electronic apparatus 100*a* provided in this embodiment is substantially similar to the electronic apparatus 100 depicted in FIG. 2A-FIG. 2C, and thus the same and similar components in these two embodiments will not be further described hereinafter. The difference between the electronic apparatus 100*a* provided in this embodiment and the electronic apparatus 100 lies in that topographies or profiles of bonding surfaces 142*a* of first bonding pads 142 are planar, and topographies or profiles of bonding surfaces 112*a* of second bonding pads 112 are jagged in the electronic apparatus 100*a* provided in the present embodiment.

Specifically, with reference to FIG. 3A, at the initial stage of bonding, only portions 112*b* of the second bonding pads 112 are allowed to contact the first bonding pads 142, and gaps A2 may be defined between the second bonding pads 112 and the first bonding pads 142 after the contact. Although FIG. 3A schematically shows three gaps A2, the disclosure does not limit the number and/or the shape of the gaps A2. In this embodiment, the portions 112*b* are, for instance, tips of the jagged bonding surfaces of the second bonding pads 112 contacting the first bonding pads 142, which should however not be construed as a limitation in the disclosure.

With reference to FIG. 3B, a diffusion reaction is initiated, so that metal atoms of the second bonding pad 112 may diffuse at the portions 112*b'* in a direction toward the first bonding pad 142 and pass through the oxidation layer 150 (or the passivation layer), and metal atoms of the first bonding pad 142 may diffuse at the portions 112*b'* in a direction toward the second bonding pad 112 and pass through the oxidation layer 160 (or the passivation layer).

Finally, with reference to FIG. 3C, the diffusion reaction continues to allow the diffused metal atoms of the second bonding pad 112 and the diffused metal atoms of the first bonding pad 142 to fill at least some of the gaps A2 between the second bonding pad 112 and the first bonding pad 142 and allow the second bonding pad 112 to be bonded to the first bonding pad 141.

In some embodiments, the topographies or the profiles of the bonding surfaces of the first bonding pads may also have a jagged shape, and the topographies or the profiles of the bonding surfaces of the second bonding pads may also have a planar shape (not shown).

Figure 4B:
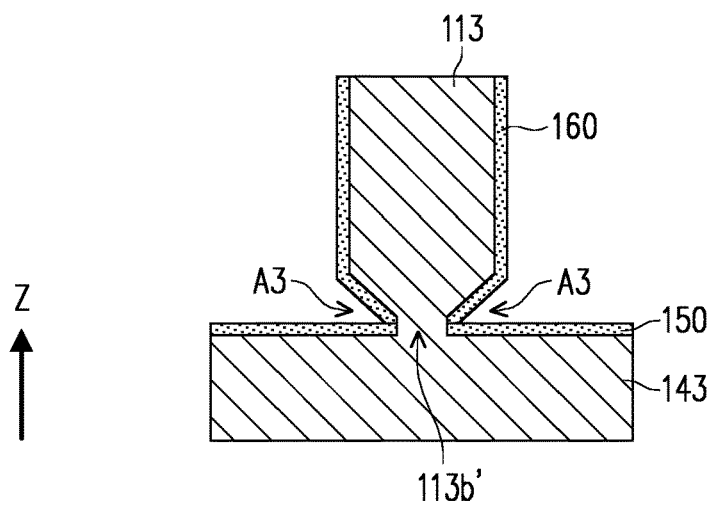
Figure 4C:
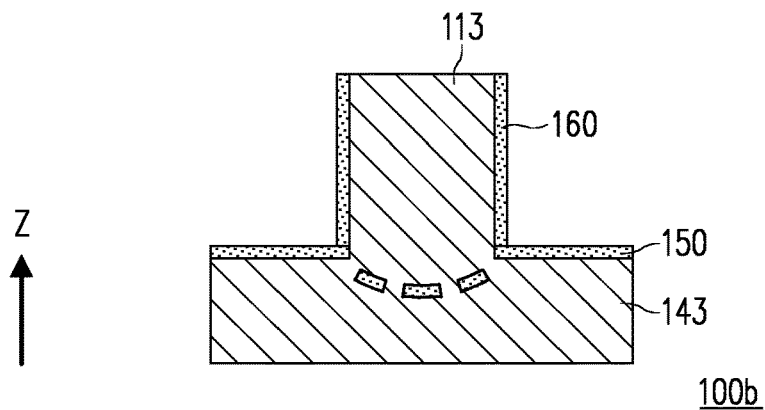

FIG. 4A to FIG. 4C are schematic partial cross-sectional diagrams illustrating a manufacturing method of an electronic apparatus according to another embodiment of the disclosure. With reference to FIG. 4A-FIG. 4C and FIG. 2A-FIG. 2C at the same time, an electronic apparatus 100*b* provided in this embodiment is substantially similar to the electronic apparatus 100 depicted in FIG. 2A-FIG. 2C, and thus the same and similar components in these two embodiments will not be further described hereinafter. The difference between the electronic apparatus 100*b* provided in this embodiment and the electronic apparatus 100 lies in that topographies or profiles of bonding surfaces 143a of first bonding pads 143 are planar, and topographies or profiles of bonding surfaces 113a of second bonding pads 113 are pyramidal.

Specifically, with reference to FIG. 4A, at the initial stage of bonding, only a portion 113b of the second bonding pad 113 is allowed to contact the first bonding pad 143, and a groove A3 may be defined between the second bonding pad 113 and the first bonding pad 143 after the contact. In this embodiment, the portion 113b is, for instance, a tip of the pyramidal bonding surface of the second bonding pad 113 contacting the first bonding pad 143, which should however not be construed as a limitation in the disclosure.

With reference to FIG. 4B, a diffusion reaction is initiated, so that metal atoms of the second bonding pad 113 may diffuse at a portion 113b' in a direction toward the first bonding pad 143 and pass through the oxidation layer 150 (or the passivation layer), and metal atoms of the first bonding pad 143 may diffuse at the portion 113b' in a direction toward the second bonding pad 113 and pass through the oxidation layer 160 (or the passivation layer).

Finally, with reference to FIG. 4C, the diffusion reaction continues to allow the diffused metal atoms of the second bonding pad 113 and the diffused metal atoms of the first bonding pad 143 to fill at least a portion of the groove A3 between the second bonding pad 112 and the first bonding pad 143 and allow the second bonding pad 113 to be bonded to the first bonding pad 143.

In some embodiments, the topographies or the profiles of the bonding surfaces of the first bonding pads may also be pyramidal, and the topographies or the profiles of the bonding surfaces of the second bonding pads may also be planar (not shown).

In addition, in some embodiments, when the diffused metal atoms of the second bonding pad and the diffused metal atoms of the first bonding pad fill the gap between the second bonding pad and the first bonding pad, residues of partial (discontinuous) oxidation layer or passivation layer may still be found at the bonding surface between the second bonding pad and the first bonding pad. Here, the residues of the oxidation layer or the residues of the passivation layer may be observed through a transmission electron microscope (TEM), for instance, which should however not be construed as a limitation in the disclosure.

To sum up, in the manufacturing method of the electronic apparatus provided in one or more embodiments of the disclosure, the first bonding pads and the second bonding pads have bonding surfaces with different surface topographies, so that only portions of the second bonding pads are allowed to contact the first bonding pads. Compared to the diffusion reaction initiated when the two matched bonding surfaces are completely in contact with each other, the diffusion reaction may be initiated at a relatively low reaction stress when only the portion of the second bonding pad is allowed to contact the first bonding pad. This may alleviate the issue of short circuit during bonding or increase the bonding yield.

Finally, it should be noted that the foregoing embodiments are merely used for describing the technical solutions of the disclosure, but are not intended to limit the disclosure. Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

What is claimed is:

1. A manufacturing method of an electronic apparatus, comprising:
   providing a substrate;
   forming a first bonding pad on the substrate;
   providing a electronic device, wherein the electronic device comprising a second bonding pad; and
   laminating the second bonding pad of the electronic device corresponding to the first bonding pad onto the corresponding first bonding pad on the substrate, so as to bond the electronic device to the substrate,
   wherein the corresponding first bonding pad and second bonding pad respectively have a bonding surface with different surface topographies,
   wherein a method of laminating the second bonding pad of the electronic device corresponding to the first bonding pad onto the corresponding first bonding pad on the substrate comprises:
      allowing a portion of the second bonding pad to contact the corresponding first bonding pad, so as to form a groove between the second bonding pad and the corresponding first bonding pad after the contact;
      performing a diffusion reaction, so as to diffuse second metal atoms of the second bonding pad and first metal atoms of the first bonding pad at the portion; and
      allowing the diffused second metal atoms and the diffused corresponding first metal atoms fill the groove.

2. The manufacturing method according to claim 1, further comprising:
   forming a passivation layer on the corresponding first bonding pad.

3. The manufacturing method according to claim 2, wherein a material of the passivation layer comprises silver, gold, chromium, hafnium, iridium, molybdenum, niobium, osmium, palladium, platinum, rhenium, rhodium, ruthenium, tantalum, titanium, vanadium, tungsten, or zirconium.

4. The manufacturing method according to claim 2, wherein a thickness of the passivation layer is less than 10 nanometers.

5. The manufacturing method according to claim 1, further comprising:
   forming an oxidation layer on the corresponding first bonding pad.

6. The manufacturing method according to claim 5, wherein a thickness of the oxidation layer is less than 10 nanometers.

7. The manufacturing method according to claim 1, wherein the bonding surface of one of the corresponding first and second bonding pads has a convex shape, and the bonding surface of the other has a concave shape.

8. The manufacturing method according to claim 7, wherein a dimension of the concave-shaped bonding surface is greater than a dimension of the convex-shaped bonding surface.

9. The manufacturing method according to claim 1, wherein materials of the corresponding first and second bonding pads are copper or gold.

10. The manufacturing method according to claim 1, wherein the electronic device is a light emitting diode.

11. The manufacturing method according to claim 1, wherein a dimension of the electronic device is less than 100 µm.

12. The manufacturing method according to claim 1, further comprising:

forming the electronic device on a growth substrate.

13. The manufacturing method according to claim 12, further comprising:

picking up the electronic device on the growth substrate by a transfer substrate.

14. The manufacturing method according to claim 1, wherein the bonding surface of one of the corresponding first and second bonding pads is shaped as a protruding rectangle, and the bonding surface of the other is shaped as a recessed inverted trapezoid.

15. The manufacturing method according to claim 14, wherein a width of a base of the inverted trapezoid is less than a width of a short side of the rectangle.

16. The manufacturing method according to claim 1, wherein the bonding surface of one of the corresponding first and second bonding pads has a planar shape, and the bonding surface of the other has a jagged shape.

17. The manufacturing method according to claim 1, wherein the bonding surface of one of the corresponding first and second bonding pads has a planar shape, and the bonding surface of the other has a pyramidal shape.

18. The manufacturing method according to claim 1, wherein the corresponding first and second bonding pads are partially overlapped in a normal direction of the substrate.

* * * * *